(12) United States Patent
Stefaner et al.

(10) Patent No.: US 9,530,678 B2
(45) Date of Patent: Dec. 27, 2016

(54) SUBSTRATE CARRIER SYSTEM FOR MOVING SUBSTRATES IN A VERTICAL OVEN AND METHOD FOR PROCESSING SUBSTRATES

(71) Applicant: Infineon Technologies AG, Neubiberg (DE)

(72) Inventors: Andreas Stefaner, Ludmannsdorf (AT); Heimo Schieder, Riegersdorf (AT); Guenter Denifl, Annenheim (AT); Roland Moennich, Villach (AT); Anton Gernot Winkler, Rosenbach (AT)

(73) Assignee: Infineon Technologies AG, Neubiberg (DE)

( * ) Notice: Subject to any disclaimer, the term of this patent is extended or adjusted under 35 U.S.C. 154(b) by 66 days.

(21) Appl. No.: 14/444,889

(22) Filed: Jul. 28, 2014

(65) Prior Publication Data

US 2016/0027677 A1    Jan. 28, 2016

(51) Int. Cl.
| | |
|---|---|
| *H01L 21/673* | (2006.01) |
| *H01L 21/677* | (2006.01) |
| *C23C 16/458* | (2006.01) |
| *H01L 21/02* | (2006.01) |
| *C23C 8/10* | (2006.01) |

(52) U.S. Cl.
CPC ........... *H01L 21/67754* (2013.01); *C23C 8/10* (2013.01); *C23C 16/458* (2013.01); *H01L 21/02233* (2013.01); *H01L 21/67309* (2013.01); *H01L 21/67313* (2013.01); *H01L 21/67757* (2013.01)

(58) Field of Classification Search
CPC ................... H01L 21/02225; H01L 21/02227; H01L 21/02296
See application file for complete search history.

(56) References Cited

U.S. PATENT DOCUMENTS

| | | | |
|---|---|---|---|
| 4,438,157 A * | 3/1984 | Romano-Moran | . H01L 21/3145 257/E21.21 |
| 4,775,317 A | 10/1988 | Schülke et al. | |
| 5,076,206 A | 12/1991 | Bailey et al. | |
| 2013/0269615 A1 | 10/2013 | Van Aerde | |

* cited by examiner

*Primary Examiner* — Cheung Lee
(74) *Attorney, Agent, or Firm* — Slater Matsil, LLP

(57) ABSTRACT

A substrate carrier system for moving substrates in a vertical oven and a method for processing substrates are disclosed. In some embodiments, a method for oxidizing material or depositing material includes carrying a plurality of substrates by a substrate carrier and inserting the substrate carrier into a vertical oven, wherein the plurality of substrates are held by the substrate carrier in predefined positions, wherein an angle measured between a main surface of a substrate of the plurality of substrates at one of the predefined positions and a vertical direction is less than 20 degrees. The method further includes oxidizing a material on the plurality of substrates or depositing a material onto the plurality of substrates.

15 Claims, 7 Drawing Sheets

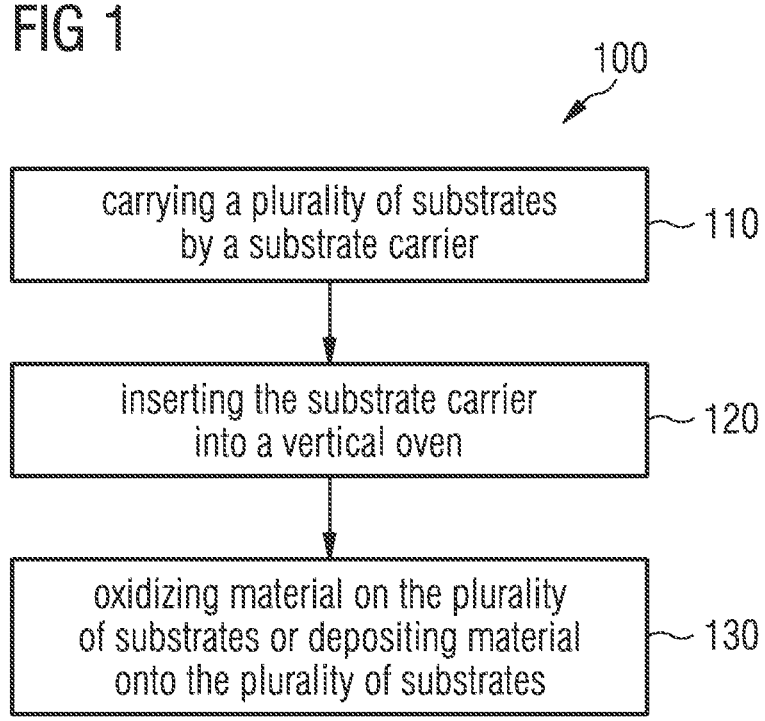

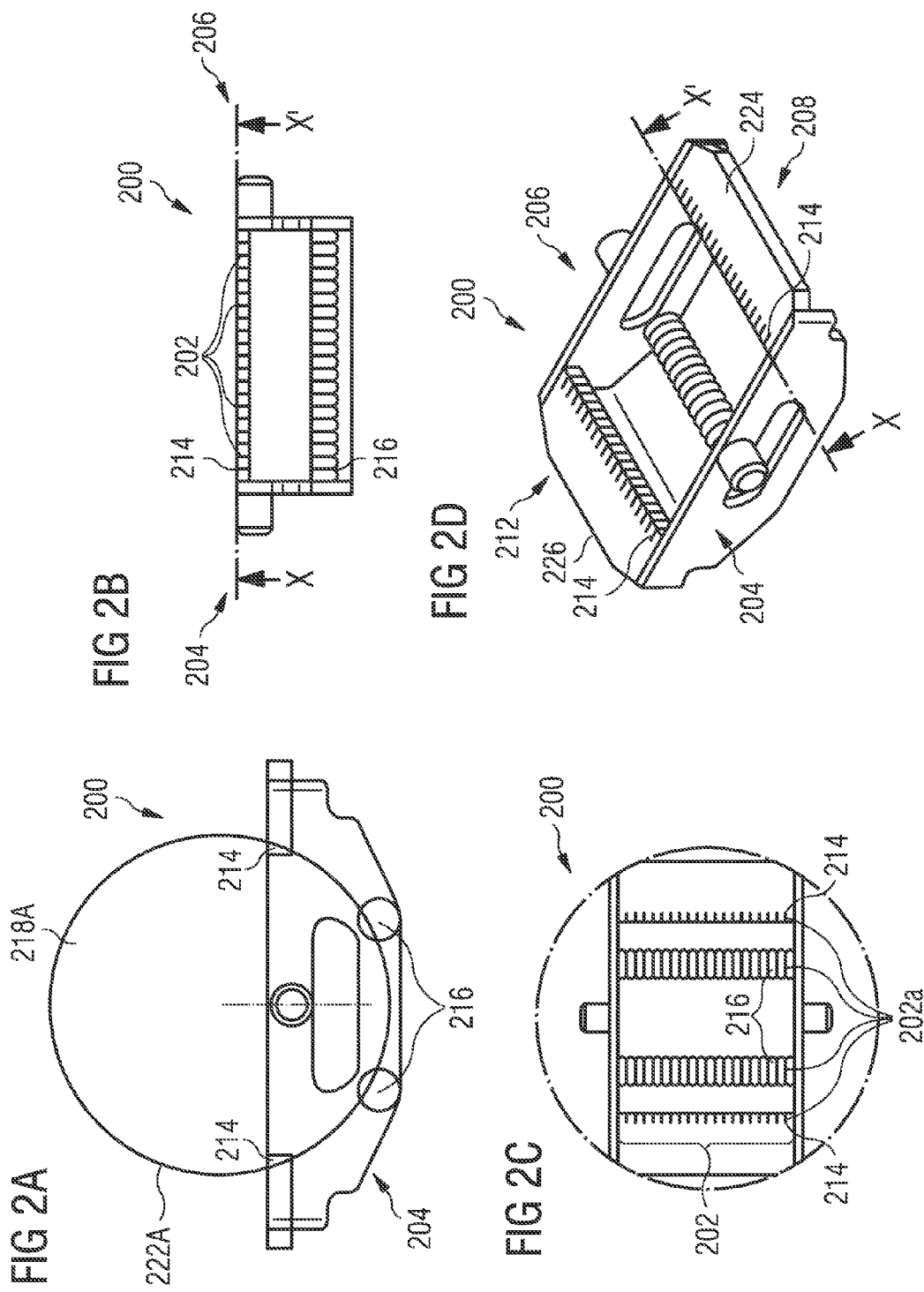

FIG 3A
FIG 3B
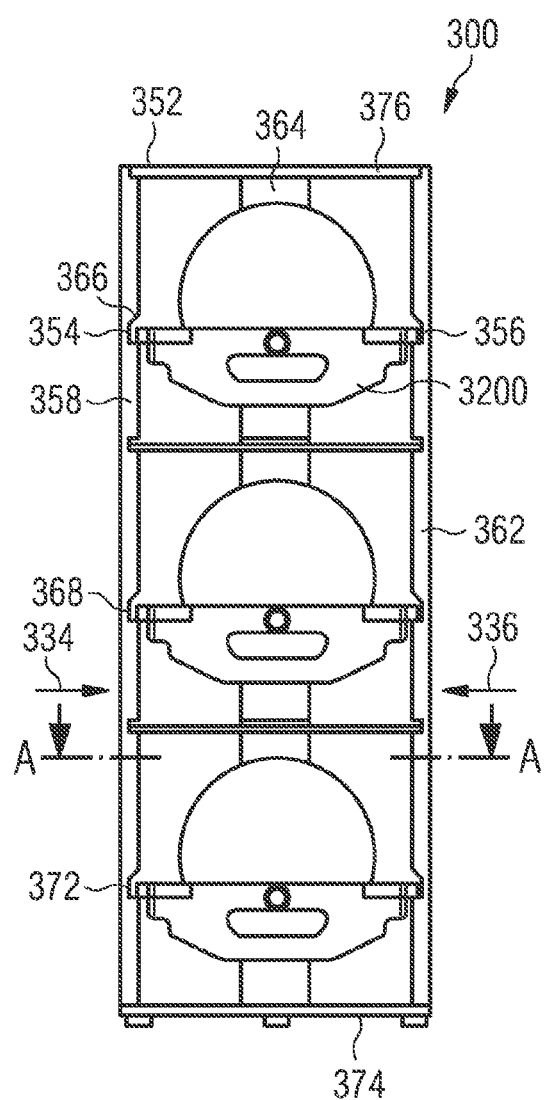
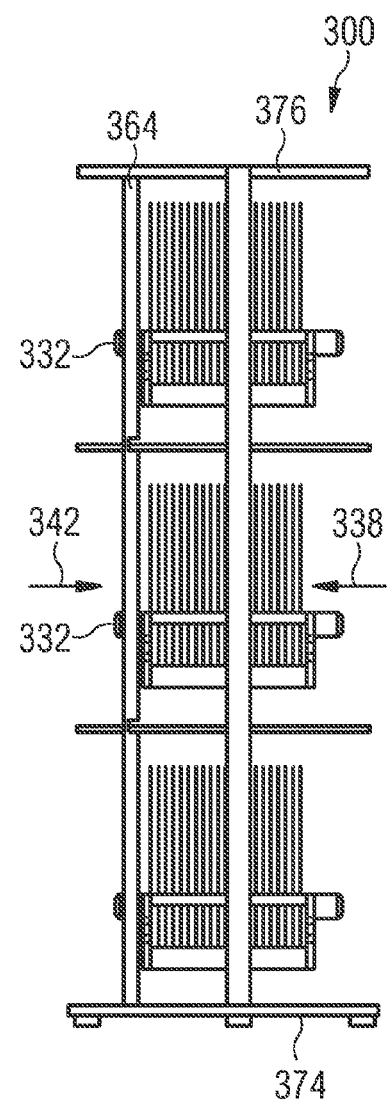

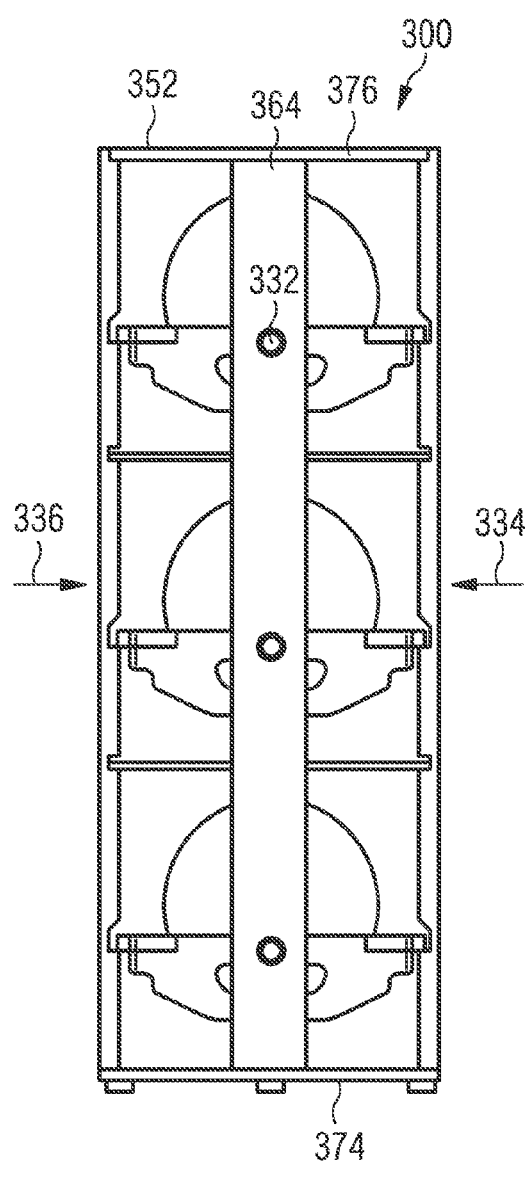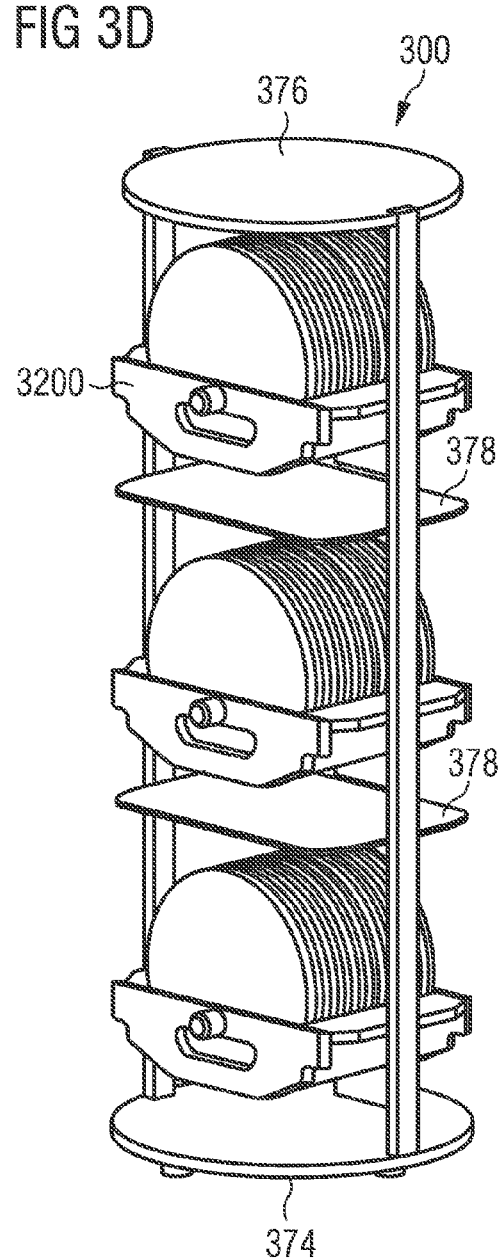

FIG 4A
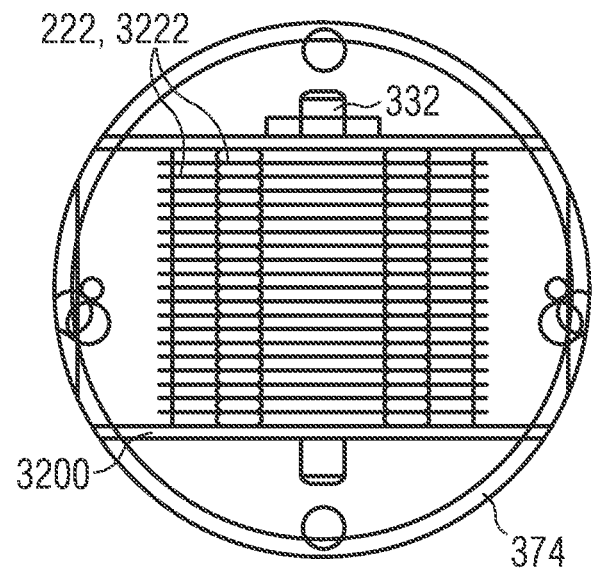
FIG 4B  Schnitt A-A
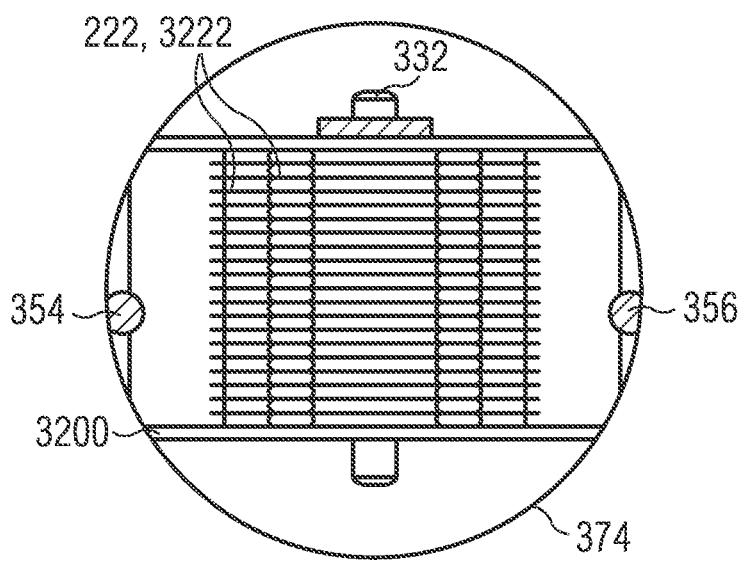

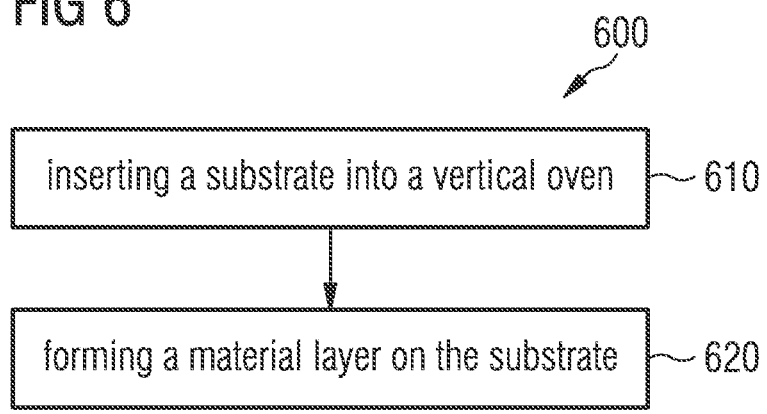

SUBSTRATE CARRIER SYSTEM FOR MOVING SUBSTRATES IN A VERTICAL OVEN AND METHOD FOR PROCESSING SUBSTRATES

TECHNICAL FIELD

Embodiments relate to manufacturing processes in vertical ovens, and in particular to a method for oxidizing material or depositing material, a substrate carrier system for carrying substrates in a vertical oven, and a vertical low pressure chemical vapor deposition oven.

BACKGROUND

Wafers may be coated or oxidized in vertical ovens in a horizontal position in a vertically standing boat in a reactor. Wafers may be loaded and/or unloaded in a horizontal position into a boat, using a robot handling system. Layer deposition in vertical ovens may be carried out in the boat(s). A boat may be positioned on a pedestal and transported into and out of the reactor using an elevator. The wafer may be supported in a low pressure chemical vapor deposition (LPCVD) standard vertical boat during the film deposition, on three or four edge supporting areas on the boat pillars, e.g. teeth. Due to the temperature load of the substrate material during the deposition, e.g. cooling and heating of the wafer, in the boat in a horizontal position, plastic deformation due to gravitation effects and higher warping of the wafer may occur. This may lead to further problems during wafer handling and the wafer may no longer be able to be further processed. Furthermore, during high temperature oxidation processes, slip lines may be created when overly large temperature changes, i.e. temperature delta, are applied to the wafer during the heating, oxidation or cooling phases. The initial points prefer the wafer supporting points in the boat, which are generated through the gravitational effects on the wafer. Special boat designs, e.g. finger boats, supporting the wafer through a rand ring, etc., may be used to reduce the effect of gravitation on the creation of slip lines during oxidation.

SUMMARY

Some embodiments relate to a method for oxidizing material or depositing material. The method may include carrying a plurality of substrates by a substrate carrier. The method may further include inserting the substrate carrier into a vertical oven. The plurality of substrates are held by the substrate carrier in predefined positions. An angle measured between a main surface of a substrate of the plurality of substrates at one of the predefined positions and a vertical direction is less than 20 degrees. The method may further include oxidizing material on the plurality of substrates or depositing material onto the plurality of substrates.

Some embodiments relate to a substrate carrier system for carrying substrates in a vertical oven. The substrate carrier system may include a substrate carrier configured to carry a plurality of substrates. The substrate carrier system may further include a substrate carrier support structure configured to be inserted along an insertion direction into the vertical oven, and to receive the substrate carrier in a direction substantially orthogonal to the insertion direction into a holding position in the substrate carrier support structure.

Some embodiments relate to a vertical low pressure chemical vapor deposition oven which includes a substrate carrier configured to carry a plurality of substrates in predefined positions. The angle measured between a main surface of a substrate of the plurality of substrates at one of the predefined positions and a vertical direction is less than 20 degrees.

Some embodiments relate to a method for forming a material layer on a substrate. The method may include inserting a substrate into a vertical oven. An angle measured between a main surface of the substrate and a vertical direction may be less than 20 degrees. The method may further include forming a material layer on the substrate.

BRIEF DESCRIPTION OF THE DRAWINGS

Some embodiments of apparatuses and/or methods will be described in the following by way of example only, and with reference to the accompanying figures, in which FIG. 1 shows a flow chart of a method for oxidizing material or depositing material;

FIGS. 2A to 2D show schematic illustrations of a substrate carrier according to various embodiments;

FIGS. 3A to 3D show schematic illustrations of a substrate carrier system according to various embodiments;

FIGS. 4A to 4B show top view illustrations of a substrate carrier system according to various embodiments;

FIG. 6 shows a method for forming a material layer on a substrate.

DETAILED DESCRIPTION OF ILLUSTRATIVE EMBODIMENTS

Figure 5:
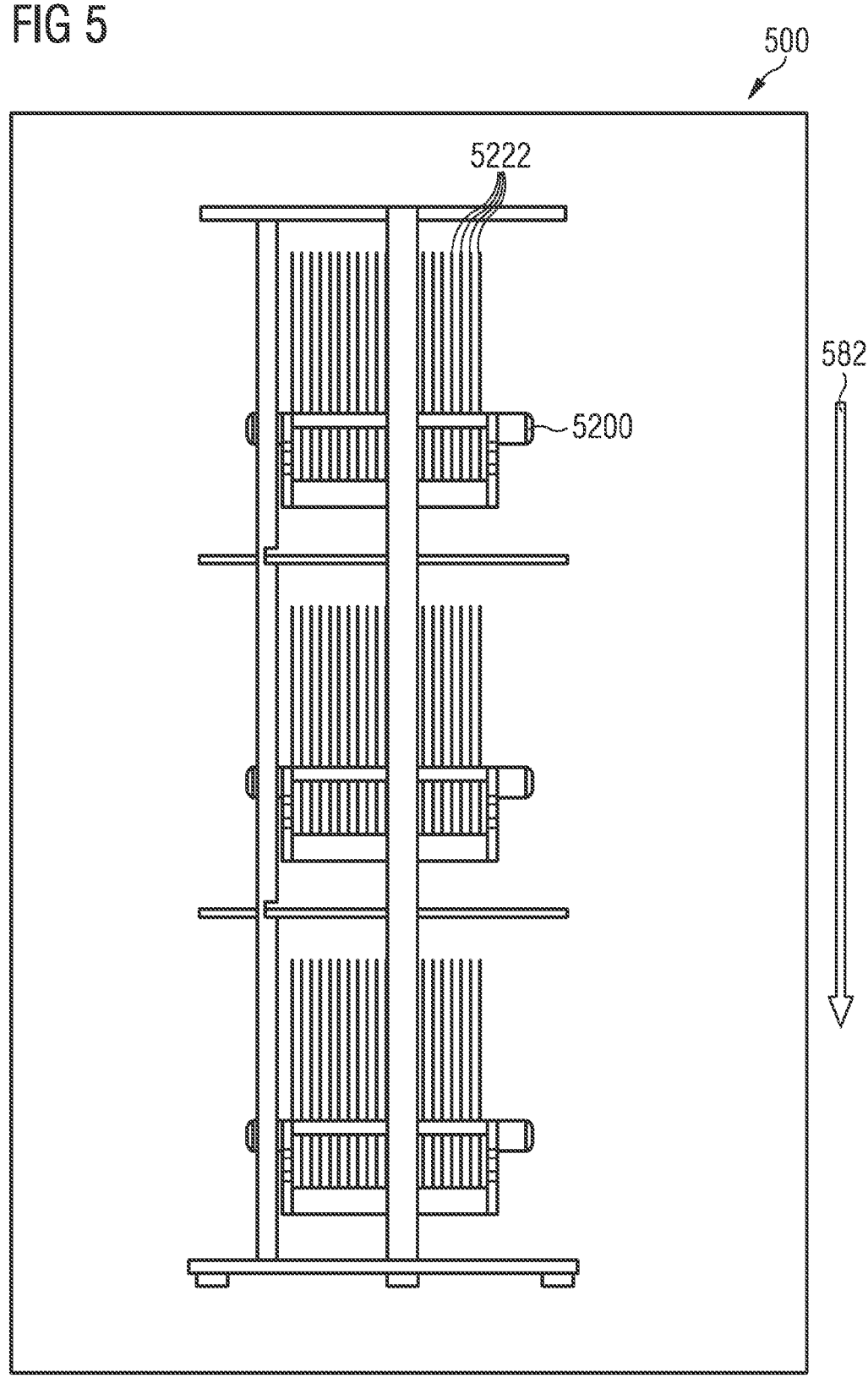
FIG. 5 shows a schematic illustration of a vertical low pressure chemical vapor deposition oven.

Various example embodiments will now be described more fully with reference to the accompanying drawings in which some example embodiments are illustrated. In the figures, the thicknesses of lines, layers and/or regions may be exaggerated for clarity.

Accordingly, while example embodiments are capable of various modifications and alternative forms, embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

FIG. 1 shows a flow chart of a method 100 for oxidizing material or depositing material according to an embodiment.

The method may include carrying 110 a plurality of substrates by a substrate carrier.

The method may further include inserting 120 the substrate carrier into a vertical oven. The plurality of substrates is held by the substrate carrier in predefined positions. An angle measured between a main surface of a substrate of the plurality of substrates at one of the predefined positions and a vertical direction is less than 20 degrees.

The method may further include oxidizing 130 material on the plurality of substrates or depositing material onto the plurality of substrates.

The vertical direction may be substantially parallel to a vertical axis of the vertical oven or the direction of gravity. For example, the vertical direction may be in a general downward direction. For example, the vertical axis of the vertical oven may be a predefined direction along which the main flow of process gases is channeled. In other words, a predefined direction along which process gases predominantly flow.

Due to the proposed positioning of the substrates (e.g. wafers) in the substrate carrier in which the substrates are arranged in the vertical oven, the effect of wafer warping due to gravitational effects may be reduced or minimized.

In various embodiments, the method 100 may be implemented as part of a deposition of low pressure chemical vapor deposition (LPCVD) layers on a substrate or a plurality of substrates in a vertical oven. In other embodiments, the method may be implemented as part of a thermal oxidation of material on the substrate or the plurality of substrates in a vertical oven.

A substrate carrier may be a carrier structure configured to hold a plurality of substrate at predefined positions. A predefined position of a substrate may define a position, an orientation and/or a distance to one or more neighboring substrates.

For example, the substrates or the plurality of substrates may be loaded in the substrate carrier so that an angle measured between a main surface of a substrate of the plurality of substrates at one of the predefined positions and a vertical direction may be less than 20 degrees. For example, an angle measured between the main surface of the substrate of the plurality of substrates at one of the predefined positions and the vertical direction may be less than 3 degrees. For example, an angle measured between the main surface of the substrate of the plurality of substrates at one of the predefined positions and the vertical direction may be around 0 degrees. In other words, the wafer may be vertically loaded in a substrate carrier.

A vertical oven may be an oven for processing substrates inserted along a substantially vertical direction. For example, the vertical oven may comprise an oven tube with an axis of symmetry oriented substantially in parallel to the direction of gravity or with a deviation of less than 10° (or less than 3° or less than 1°) from the direction of gravity.

For example, the plurality of substrates may be temperature sensitive substrate wafers. For example, the plurality of substrates may be glass or plastic wafers. In other embodiments, the plurality of substrates may be silicon-based semiconductor substrates, silicon carbide-based semiconductor substrates, gallium arsenide-based semiconductor substrates, gallium nitride-based semiconductor substrates, aluminum gallium nitride-based semiconductor substrates or gallium nitride-based semiconductor substrates.

A main surface of a substrate may be a surface of the substrate intended to be processed. For example, a structure on the main surface is intended to be oxidized or material is intended to be deposited on the main surface. The main surface of a substrate may be a substantially even plane (e.g. neglecting unevenness of the semiconductor structure due to the manufacturing process and trenches). For example, the lateral dimension of the main surface of the substrate may be more than 100 times larger (or more than 1000 times or more than 10000 times) than a maximal height of structures on the main surface.

The positioning of the substrate or wafer, for example, so that an angle measured between a main surface of a substrate of the plurality of substrates at one of the predefined positions and a vertical direction may be less than 20 degrees (e.g. near vertical), less than 3 degrees (substantially vertical) or around 0 degrees (e.g. vertical), may lead to desirable effects for example, in thin wafers and temperature-sensitive material based wafers, e.g. plastic and/or glass substrates. Due to the effect of the above wafer positioning, e.g. near vertical or substantially vertical or vertical wafer positioning, gravity may tend to work on the edge and not orthogonal to the wafer surface. This may allow for the further processing of temperature-sensitive substrates, e.g. glass wafers and/or thin glass wafers in the semiconductor process cycle.

Due to the effect of the arrangement of wafers, so that an angle measured between a main surface of a substrate of the plurality of substrates at one of the predefined positions and a vertical direction may be less than 20 degrees (or less than 3 degrees, around 0 degrees) in a substrate carrier support structure (e.g. the vertical boat) other desirable effects may be achieved in the manufacturing of MEMS components in the semiconductor industry, notably, with larger substrate diameters. As a result, the construction of a special horizontal oven may no longer be needed.

For example, oxidizing the material on the plurality of substrates or depositing the material onto the plurality of substrates may include heating the vertical oven to a temperature above 80% (or above 90%) of a melting point of a substrate of the plurality of substrates. For example, the plurality of substrates are silicon or silicon based substrates, the vertical oven may be heated to a temperature above 1050° C., e.g. ranging from 1050° C. to about 1250° C. For example, the plurality of substrates are glass or glass based substrates, the vertical oven may be heated to a temperature above 400° C. (or above 450° C. or above 500° C.).

For example, one or more substrates (e.g. one or more wafers) may be loaded e.g. vertically, in a substrate carrier, which may be a special cassette drawer. The substrate carrier may then be subsequently loaded into a special vertical boat. For example, the substrate, e.g. the wafer, or the plurality of substrates, may hence be processed vertically standing.

The deposition of material according to the method 100 may include depositing at least one material from the following group of materials onto the plurality of substrates. For example, the group of materials may include tetraethyl orthosilicate, polysilicon, doped amorphous silicon, undoped amorphous silicon and silicon nitride. The effect of gravity here during the coating may also minimize bending and/or warping of the eventually resulting wafer. For example, the deposition of material according to the method, i.e. the LPCVD coating of thinned wafers, e.g. thin raw material wafers, is also conceivable, with vertical or near vertical or substantially vertical positioning in a vertical oven.

For example, due to the positioning of the wafers to be coated in the special cassette drawers in which the wafers may be arranged in a vertical position in the vertical oven as described in various embodiments, the effect of wafer warping due to gravitational effects may be minimized. In other words, this method of coating may make possible the minimization of wafer bending through gravitational effects during the layer deposition. For example, the vertical positioning of wafers may minimize the gravitational effect at high temperature oxidation on supporting points. As a result, the deposition of LPCVD layers, e.g. deposited oxides, e.g. TEOS, polysilicon, doped or undoped amorphous silicon layers, nitride, on temperature sensitive substrate wafers, e.g. glass, plastic wafers, thin wafers, may be possible.

For example, in comparison to horizontal positioning in vertical boats, the vertical positioning of wafers in the cassette drawers makes possible the coating of substrates with very large wafer diameters (e.g. 300 mm, 450 mm or more) while incurring low or minimal wafer bending.

Oxidizing of material may be carried out according to the method described above. The positioning may avoid slip lines. In particular, oxidizing of material according to the method, for example, high temperature oxidation of wafers in near vertical or substantially vertical or vertical positioning in a vertical boat may avoid slip lines which may be generated through gravitational effects preferentially at the support points at the wafer edge, when held in horizontal positioning in vertical boats. By the vertical, zero degree positioning of the wafer in the cassette drawer, the resulting effect during the oxidation may be minimized, for example, with respect to FZ base materials, e.g. CZ material with small oxygen content (area 1 or 2 to 4 or $6 \times 10^{17}$ per $cm^3$) in base material. As it is possible to carry out the above processing methods in in a vertical oven, no additional special equipment may be needed.

For example, a substrate of the plurality of substrates or the plurality of substrates may have a thickness ranging from 10 μm to 2 mm, e.g. from 30 μm to 1 mm, e.g. from 50 μm to 800 μm. A thin film substrate may be a substrate with a thickness between 10 μm and 200 μm. For example, a substrate of the plurality of substrates or the plurality of substrates may have a substrate diameter of substantially 200 mm, substantially 300 mm, of substantially 400 mm.

For example, the substrates of the plurality of substrates may be substantially equal substrates. In other words, the substrates of the plurality of substrates may be similar to each other or may be identical to each other. For example, the plurality of substrates may have the same or similar material composition. For example, the plurality of substrates may have the same or similar diameter or thickness.

For example, the method 100 may further include receiving the substrate carrier into a holding position in a substrate carrier support structure in a direction substantially orthogonal to an insertion direction. The method 100 may further include inserting the substrate carrier support structure along the insertion direction into the vertical oven.

For example, the method may further include guiding the substrate carrier in the direction substantially orthogonal to the insertion direction towards the holding position by engaging a first lateral guide and a second lateral guide located respectively on a first lateral side and an opposite second lateral side of the substrate carrier with a first lateral guide and a second lateral guide located respectively in a first longitudinal support structure and a second longitudinal support structure of the substrate carrier support structure. The method may further include receiving the substrate carrier into the holding position by stopping the insertion of the substrate carrier at the holding position by a third longitudinal support structure of the substrate carrier support structure.

A longitudinal support structure may be a structure of the substrate carrier support structure comprising a largest extension in the insertion direction or vertical direction. For example, a longitudinal support structure may be a bar, a pillar or a side panel.

Due to the implementation of guiding the substrate carrier in the direction substantially orthogonal to the insertion direction, and receiving the substrate carrier at the holding position, the substrate carrier may be easily loaded and unloaded into the substrate carrier support structure.

For example, the method may further include preventing a movement of the substrate carrier at the holding position at least in one direction by fastening a fastening structure located on a third lateral side of the substrate carrier to a third longitudinal support structure.

Due to the implementation of fastening a fastening structure located on a third lateral side of the substrate carrier to the third longitudinal support structure, the substrate carrier may be held securely in the substrate carrier support structure.

For example, the method 100 may further include receiving one or more further substrate carriers in a direction substantially orthogonal to the insertion direction into one or more further holding positions in the substrate carrier support structure. The one or more further holding positions may be arranged above each other or stack-wise in the vertical direction in the substrate carrier support structure, and separated by a vertical displacement in the vertical direction or a direction parallel to the insertion direction.

Due to the implementation of receiving one or more further substrate carriers in the substrate carrier support structure, the substrate carriers may be separated or compartmentalized (e.g. example through the use of horizontal plates arranged between the substrate carriers). For example, it may be possible to achieve identical or similar coating conditions (gas flow), in the individual substrate carrier areas.

FIGS. 2A to 2D show various illustrations of a substrate carrier 200 according to an embodiment. FIG. 2A shows a schematic view of the substrate carrier 200 from a front side. FIG. 2B shows a schematic cross-section view of the substrate carrier 200 from a lateral side cut along XX'. FIG. 2C shows a schematic top view of the substrate carrier 200. FIG. 2D shows a schematic illustration of the substrate carrier 200.

The substrate carrier 200 may have a curved bottom side, whose curvature may be similar to the curvature of a substrate edge. For example, the substrate carrier 200 may have a curved bottom side which may have a semi-circular curvature which may be similar to the curvature of a substrate edge. For example, the substrate carrier 200 may have a cradle shape, or a U-shape. In other words, the substrate carrier may be implemented as a cradle carrier for carrying a plurality of substrates.

As shown in FIG. 2D, the substrate carrier 200 may have a front side 204 and an opposite back side 206. The substrate carrier 200 may further include a first lateral side 208 and an opposite second lateral side 212 (e.g. the first lateral side faces the second lateral side). The first lateral side 208 and the second lateral side 212 may connect the front side 204 and the back side 206.

As shown in FIGS. 2A to 2D, the substrate carrier 200 may include a plurality of slots 202. One slot 202a of the plurality of slots 202 is illustrated in FIG. 2C. Each slot 202a may be configured to support a substrate edge region, and to align the plurality of substrates at the predefined positions so that the main surfaces of the plurality of substrates are substantially parallel to each other. For example, each slot 202a may be configured to hold a rim of the substrate along at least a partial circumference of the substrate. For example, the main surface of a substrate may refer to a macroscopically planar surface of the substrate.

The plurality of slots 202 may be arranged in the substrate carrier 200. Each slot 202A may include a pair of outer slits 214, and a pair of inner slits 216. The pair of outer slits 214 and the pair of inner slits 216 may be located along the inner, i.e. concave, side of the curved bottom side of the substrate carrier, which allows them to contact a convex, curved substrate edge region, e.g. a semi-circular partial circumference of the substrate. The pair of outer slits 214 and the pair of inner slits 216 of a slot 202A may be arranged in the substrate carrier. A substrate edge region of a substrate may be supported by standing in or by being slotted into the outer slits 214 and the inner slits 216. The pair of outer slits 214 and the pair of inner slits 216 of a slot 202A may be aligned so that the slits are substantially parallel to the front side 204 and/or the back side 206 of the substrate carrier 200. The pair of outer slits 214 and the pair of inner slits 216 may be aligned along the at least partial circumference of a macroscopically planar substrate. As a result, a main surface 218A of a substrate 222A sitting in a slot 202A, may be substantially parallel to the front side 204 and/or the back side 206 of the substrate carrier 200. The pair of inner slits 216 may be arranged between the pair of outer slits 214. The pair of outer slits 214 may be spaced further apart than the pair of inner slits 216. The outer slits 214 may be configured to hold the substrate edge region at a wider partial circumference of the substrate than the inner slits 216.

Due to the alignment of the pair of outer slits 214 and the pair of inner slits 216 of each slot 202A in the substrate carrier 200, each substrate of the plurality of substrates may be carried by a slot of the plurality of slots, and the main surfaces 218 of the plurality of substrates 222 carried by the substrate carrier 200 at the predefined positions may be substantially parallel to each other.

More details and aspects are mentioned in connection with the embodiments described above or below (e.g. regarding the substrate carrier and the plurality of substrates). The embodiments shown in FIGS. 2A to 2D may each comprise one or more optional additional features corresponding to one or more aspects mentioned in connection with the proposed concept or one or more embodiments described above (e.g. FIG. 1) or below (e.g. FIG. 3A to 6).

FIGS. 3A to 3D show various schematic illustrations of a substrate carrier system 300 for carrying substrates in a vertical oven according to various embodiments. FIG. 3A shows a schematic illustration of the substrate carrier system 300 viewed from a front side, of a substrate carrier support structure 352. FIG. 3B shows a schematic illustration of the substrate carrier system 300 viewed from a first lateral side 334, of the substrate carrier support structure 352. FIG. 3C shows a schematic illustration of the substrate carrier system 300 viewed from a back side 342 of the substrate carrier support structure 352.

The substrate carrier system 300 may include a substrate carrier 3200 configured to carry a plurality of substrates 3222. The substrate carrier 3200 of substrate carrier system 300 may be a substrate carrier such as the substrate carrier 200 described in FIG. 2 and implemented in the method described according to FIG. 1. The substrate carrier 3200 may include one or more or all of the features already described with respect to substrate carrier 200. The plurality of substrates 3222 may include one or more or all of the features already described with respect to the plurality of substrates 222.

The substrate carrier system 300 may further include a substrate carrier support structure 352 configured to be inserted along an insertion direction into the vertical oven. Further, the substrate carrier support structure 352 is configured to receive the substrate carrier 3200 in a direction substantially orthogonal to the insertion direction into a holding position in the substrate carrier support structure 352. For example, the insertion direction may be substantially parallel to a vertical axis of the vertical oven or the direction of gravity.

A plurality of substrates 3222 may be carried by the substrate carrier 3200. An angle measured between a main surface of a substrate of the plurality of substrates 3222 at one of the predefined positions and a vertical direction may be less than 20 degrees. In other words, the substrates may stand in the substrate carrier (e.g. in the cassette) at an angle of less than 20 degrees to the longitudinal axis (e.g. vertical axis) of the substrate carrier support structure 352. In some cases, the angle may be nearly zero degrees to the longitudinal axis (e.g. vertical axis) of the substrate carrier support structure 352. The range of the angle, for example, whether the angle is nearly zero degrees to the longitudinal axis of the vertical boat, is determined by the slot width, which are the positions of the edgewise (lateral) supporting points of the wafer.

The substrate carrier support structure 352 may include a first longitudinal support structure 358, a second longitudinal support structure 362 and a third longitudinal support structure 364. Instead of the slits for wafers, (e.g. in horizontal wafer arrangements), special support structures, e.g. longitudinal support structures 358, 362, 364, e.g. three special boat bridges may be used. The two front bridges 358, 362 may each possess one or more drawers, e.g. three drawers 366, 368, 372, for guiding the cassette drawers (the substrate carriers), in which the wafers are processed. The dimensions of the substrate carrier support structure 352 (e.g. the boat) correspond to the dimensions of a vertical oven boat.

The first longitudinal support structure 358, the second longitudinal support structure 362 and the third longitudinal support structure 364 may be supported by one or more connecting pieces, e.g. a base stand or base plate 374 and/or a top bridge or top plate 376, which may hold the first longitudinal support structure 358, the second longitudinal support structure 362, and the third longitudinal support structure 364 together in predefined structural positions. For example, the first longitudinal support structure 358 may be arranged on a first lateral side 334 of the substrate carrier support structure 352. For example, the second longitudinal support structure 362 may be arranged on an opposite second lateral side 336 of the substrate carrier support structure 352. For example, the third longitudinal support structure 364 may be arranged on a further lateral side, e.g. a back side 342 of the substrate carrier support structure 352.

The substrate carrier support structure 352 may have a vertical (e.g. longitudinal axis) orthogonal, e.g. substantially perpendicular to a horizontal axis. For example, the vertical (e.g. longitudinal) axis may be substantially parallel to a vertical axis of the vertical oven or the direction of gravity. The substrate carrier support structure 352 may have a horizontal axis parallel to the line AA. The first longitudinal support structure 358, the second longitudinal support structure 362, and the third longitudinal support structure 364 may each have a longitudinal axis (direction of largest extension) which is substantially parallel to the vertical axis of the substrate carrier support structure 352. For example, the one or more connecting pieces, may hold the first longitudinal support structure 358, the second longitudinal support structure 362, and the third longitudinal support structure 364.

Due to the implementation of the one or more connecting pieces holding the first longitudinal support structure 358, the second longitudinal support structure 362 and the third longitudinal support structure 364, the substrate carrier support structure 352 may be held stably and securely when inserted into the vertical oven. The vertical (e.g. longitudinal) axis of the substrate carrier support structure 352 may be substantially parallel to a vertical axis of the vertical oven or the direction of gravity.

The substrate carrier, e.g. substrate carrier 200, 3200, may include a first lateral guide 224 and a second lateral guide 226 located respectively on the first lateral side 208 of the substrate carrier 3200 and the opposite second lateral side 212 of the substrate carrier 3200 (shown in FIG. 2D).

The first longitudinal support structure 358 may include a first lateral guide 354 and the second longitudinal support structure 362 may include a second lateral guide 356. The first lateral guide 354 and the second lateral guide 356 may be configured to guide the substrate carrier in a direction substantially orthogonal to the insertion direction to the holding position when the first lateral guide 224 and the second lateral guide 226 of the substrate carrier engage with the first lateral guide 354 and the second lateral guide 356 of the substrate carrier support structure. For example, the one or more connecting pieces, may hold the first longitudinal support structure 358 and the second longitudinal support structure at a predefined structural distance apart, so that the first longitudinal support structure 358 and the second longitudinal support structure 362 may engage the first 208 and second 212 lateral sides respectively, for example, with the first lateral guide 224 and the second lateral guide 226 of the substrate carrier 3200 respectively. The first lateral guide 354 and the second lateral guide 356 of the substrate carrier support structure may be part of a first drawer 366. Further drawers e.g. 368, 372, may be configured or constructed similarly to the first drawer 366, each further drawer having a pair of lateral guides for guiding a substrate carrier into a further holding position in the substrate carrier support structure.

For example, the first lateral guide 224 and the second lateral guide 226 of the substrate carrier may each be a lateral protrusion having a similar lateral length to the first lateral side 208 and the second lateral side respectively 212. Further, the first lateral guide 354 and the second lateral guide 356 of the substrate carrier support structure may each be a notch for receiving the lateral protrusions. The substrate carrier, e.g. substrate carrier 200, 3200, may be guided in the direction substantially orthogonal to the insertion direction towards the holding position by engaging the first lateral guide 224 and the second lateral guide 226 located respectively on the first lateral side 208 and the opposite second lateral side 212 of the substrate carrier with the first lateral guide 354 and the second lateral guide 356 located respectively in a first longitudinal support structure 358 and a second longitudinal support structure 362 of the substrate carrier support structure 352. In other words, the lateral protrusions may pass through the notches in the direction substantially orthogonal to the insertion direction towards the holding position.

For example, the protrusion-notch arrangement may be reversed. For example, the first lateral guide 354 and the second lateral guide 356 of the substrate carrier support structure may each be a lateral protrusion having a similar lateral length to the first lateral side 208 and the second lateral side respectively 212 and the first lateral guide 224 and the second lateral guide 226 of the substrate carrier may each be a notch for receiving the lateral protrusions.

The substrate carrier 3200 may be received into the holding position by stopping the insertion of the substrate carrier 3200 at the holding position by the third longitudinal support structure 364 of the substrate carrier support structure 352.

Movement of the substrate carrier 3200 at the holding position may be prevented at least in one direction by fastening a fastening structure 332 located on a third lateral side, e.g. a front side 204 of the substrate carrier to the third longitudinal support structure 364. The third longitudinal support structure, e.g. bridge, may be wider than the first 358 and the second 362 longitudinal support structure. For example, the third longitudinal support structure 364 may be configured to stop the insertion of the substrate carrier at the holding position. For example, the substrate carrier 3200 may include a fastening structure 332 implemented by a nut, a hole, a nose or a protrusion located on a third lateral side 204 of the substrate carrier 3200 configured to prevent a movement of the substrate carrier 3200 at the holding position at least in one direction (e.g. orthogonal to the insertion direction and a direction of movement of the substrate carrier in the holding position) by engaging with the third longitudinal support structure 364. Further, the third longitudinal support structure 364 may comprise a corresponding hole, nut, nose or protrusion engaging the fasting structure 332 of the substrate carrier in the holding position. In other words, this wide back side bridge may serves to fix the cassette drawer using a nut. A part corresponding to the nut may be located at the back side 206 of the cassette drawer.

The substrate carrier support structure 352 may be inserted along the insertion direction into the vertical oven. The substrate carrier, e.g. substrate carrier 200, 3200 may be inserted into the vertical oven in the substrate carrier support structure 352. The plurality of substrates may be held by the substrate carrier, e.g. substrate carrier 200, 3200 in predefined positions. An angle measured between a main surface of a substrate of the plurality of substrates 3222 at one of the predefined positions and a vertical direction may be less than 20 degrees.

For example, the substrate carrier support structure 352 may be configured to be fixed in a vertical direction in the vertical oven. The vertical axis of the substrate carrier support structure 352 may be parallel to the vertical axis of the vertical oven.

For example, the vertical oven may be a chemical vapor deposition oven (e.g. a low pressure chemical vapor deposition oven) or the vertical oven may be an oxidation oven.

The special cassette drawers (e.g. the substrate carriers) and accordingly the corresponding vertical boat (e.g. the substrate carrier support structure) for holding the cassette drawers, can be made of available semiconductor boat materials. For example, the substrate carrier and the substrate carrier support structure may be at least partly made of quartz or silicon carbide, for example.

For example, material on the plurality of substrates may be oxidized, or material may be deposited onto the plurality of substrates. The oxidizing or deposition processes may be carried out according to the methods and processes already described with respect to FIG. 1.

For example, more than one cassette drawer, e.g. a plurality of cassette drawers with wafers may be positioned in the vertical boat. For example, the substrate carrier support structure 352 may have one or more drawers, e.g. drawers 366, 368, 372, for guiding the substrate carriers into the substrate carrier support structure 352. For example, the substrate carrier support structure 352 may have one, or two or three or more pairs of lateral guides 354, 356, each pair of lateral guides configured as a single drawer, which may be further configured to receive one or more further substrate carriers in a direction substantially orthogonal to the insertion direction into one or more further holding positions in the substrate carrier support structure. In other words, the substrate carrier support structure 352 may be further configured to receive one or more further substrate carriers in a direction substantially orthogonal to the insertion direction into one or more further holding positions in the substrate carrier support structure. For example, the one or more further holding positions may be arranged stack-wise in the substrate carrier support structure, e.g. one above the other, and separated by a vertical displacement in a direction parallel to the insertion direction, e.g. in a direction parallel to the vertical axis of the substrate carrier support structure.

By using a plurality of cassette drawers in the special vertical boats, the cassettes can be separated or compartmentalized through the use of horizontal plates 378 so that it may be possible to achieve identical coating conditions (gas flow), in the individual cassette areas, for example.

The number of wafers, which may be processed during the coating, may be adjusted by the wafer to wafer distance in the cassette drawer (e.g. depending on the demands on layer thickness uniformity and thermal budget). For example, each cassette drawer or substrate carrier 3200 may have at least a number n of slots 202 to carry a number n of substrates. For example, n may be greater than or equal to 25, e.g. n may be greater than or equal to 35, e.g. n may be greater than or equal to 50. For example, the slot-to-slot distance, i.e. the distance between neighboring slots, may be about 3 mm. In some embodiments, the slot-to-slot distance may be greater than 3 mm, e.g. between 7 mm to 10 mm. In some embodiments, the wafer-to-wafer distance, i.e. the distance between neighboring wafers may be about 3 mm. In some embodiments, the wafer-to-wafer distance may be greater than 3 mm, e.g. between 7 mm to 10 mm. The cassette drawers can (e.g. according to the processes requirements) each have different or equal wafer gaps, and consequently carry different or equal wafer numbers per boat or substrate carrier. For example, different cassette drawers in a single boat may have different wafer numbers. The limitations may depend on the radius of the oven pipes and the maximal dimensions of the cassette drawers, for example.

The wafers to be coated may be loaded into the cassette drawers with the help of a transfer device. Subsequently, an assembly of the special vertical boat with the cassette using a robot system may be conceivable.

More details and aspects are mentioned in connection with the embodiments described above or below (e.g. regarding the substrate carrier and the plurality of substrates). The embodiments shown in FIGS. 3A to 3D may each comprise one or more optional additional features corresponding to one or more aspects mentioned in connection with the proposed concept or one or more embodiments described above (e.g. FIG. 1, FIG. 2A to 2D) or below (e.g. FIGS. 4A to 6).

FIGS. 4A and 4B show a top view of a substrate carrier system according to various embodiments. The substrate carrier system may be a substrate carrier system described with respect to FIGS. 3A to 3D.

FIG. 4A shows one or more connecting pieces, e.g. a base stand or base plate 374 and/or a top bridge or top plate 376 of a substrate carrier support structure, e.g. 352, of the substrate carrier system. The substrate carrier support structure 352 is shown to hold a substrate carrier 3200 at a holding position. The substrate carrier 3200 is shown to be carrying a plurality of substrates, e.g. the plurality of substrates 222 or 3222 described above.

FIG. 4B shows a schematic top view of the substrate carrier system through the cross sectional line AA (shown in FIG. 3A). In this view, the substrate carrier system 300 may be seen. The substrate carrier support structure 352 is shown to hold a substrate carrier 3200 at a holding position. The first 354 and second 356 lateral guide of the substrate carrier support structure 352 may engage the first 208 and second 212 lateral sides respectively of the substrate carrier 3200. The substrate carrier 3200 is shown to be carrying a plurality of substrates, e.g. the plurality of substrates 222 or 3222 described above.

More details and aspects are mentioned in connection with the embodiments described above or below (e.g. regarding the substrate carrier and the plurality of substrates). The embodiments shown in FIGS. 4A to 4B may each comprise one or more optional additional features corresponding to one or more aspects mentioned in connection with the proposed concept or one or more embodiments described above (e.g. FIG. 1, FIG. 2A to 2D, 3A to 3D) or below (e.g. FIGS. 5 and 6).

FIG. 5 shows a schematic of a vertical low pressure chemical vapor deposition oven 500 according to various embodiments. The vertical low pressure chemical vapor deposition 500 oven may include a substrate carrier 5200 configured to carry a plurality of substrates 5222 in predefined positions. The angle measured between a main surface of a substrate of the plurality of substrates at one of the predefined positions and a vertical direction 582 is less than 20 degrees.

The vertical low pressure chemical vapor deposition oven 500 may include one or more or all of the features already described with respect to the vertical oven described above, e.g. with respect to FIGS. 1, 2A to 2D, 3A to 3D and 4A to 4B. The substrate carrier 5200 may include one or more or all of the features already described above with respect to substrate carrier 200, 3200.

Due to the positioning of the substrates in the substrate carrier in which the substrates are arranged in the vertical low pressure chemical vapor deposition oven, the effect of wafer warping due to gravitational effects may be minimized.

More details and aspects are mentioned in connection with the embodiments described above or below (e.g. regarding the substrate carrier, the substrate carrier support structure and the plurality of substrates). The embodiments shown in FIG. 5 may comprise one or more optional additional features corresponding to one or more aspects mentioned in connection with the proposed concept or one or more embodiments described above (e.g. FIGS. 1 to 4B) or below (e.g. FIG. 6).

FIG. 6 shows a flow chart of a method 600 for forming a material layer on a substrate according to an embodiment.

The method 600 includes inserting 610 a substrate into a vertical oven, wherein an angle measured between a main surface of the substrate and a vertical direction is less than 20 degrees.

The method 600 further includes forming 620 a material layer on the substrate.

Due to the proposed positioning of the substrate in the vertical oven, the effect of wafer warping due to gravitational effects may be reduced or minimized.

For example, forming the material layer on the substrate may include oxidizing or depositing material onto the substrate.

More details and aspects are mentioned in connection with the embodiments described above (e.g. regarding the substrate and the vertical oven). The embodiments shown in FIG. 6 may comprise one or more optional additional features corresponding to one or more aspects mentioned in connection with the proposed concept or one or more embodiments described above (e.g. FIGS. 1 to 5).

Various embodiments relate to a cassette drawer for the vertical positioning of wafers in a vertical boat. Various embodiments relate to the vertical positioning of wafers during low pressure chemical vapor deposition or thermal oxidation in vertical ovens. Various embodiments relate to substrate carrier, e.g. a cassette drawer, which may make possible the vertical positioning of the wafer in a vertical oven. Various embodiments relate to a special boat, in which the cassette drawer can be loaded.

Example embodiments may further provide a computer program having a program code for performing one of the above methods, when the computer program is executed on a computer or processor. A person of skill in the art would readily recognize that acts of various above-described methods may be performed by programmed computers. Herein, some example embodiments are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. Further example embodiments are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

Functional blocks denoted as "means for . . . " (performing a certain function) shall be understood as functional blocks comprising circuitry that is configured to perform a certain function, respectively. Hence, a "means for s.th." may as well be understood as a "means configured to or suited for s.th.". A means configured to perform a certain function does, hence, not imply that such means necessarily is performing the function (at a given time instant).

Functions of various elements shown in the figures, including any functional blocks labeled as "means", "means for providing a sensor signal", "means for generating a transmit signal.", etc., may be provided through the use of dedicated hardware, such as "a signal provider", "a signal processing unit", "a processor", "a controller", etc. as well as hardware capable of executing software in association with appropriate software. Moreover, any entity described herein as "means", may correspond to or be implemented as "one or more modules", "one or more devices", "one or more units", etc. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons.

Furthermore, in some embodiments a single act may include or may be broken into multiple sub acts. Such sub acts may be included and part of the disclosure of this single act unless explicitly excluded.

What is claimed is:

1. A method for oxidizing material or depositing material, the method comprising:
   carrying a plurality of substrates by a substrate carrier;
   inserting the substrate carrier into a vertical oven, wherein the plurality of substrates are held by the substrate carrier in predefined positions, wherein an angle measured between a main surface of a substrate of the plurality of substrates at one of the predefined positions and a vertical direction is less than 20 degrees; and
   oxidizing a material on the plurality of substrates or depositing a material onto the plurality of substrates.

2. The method according to claim 1, wherein the angle measured between the main surface of the substrate of the plurality of substrates at one of the predefined positions and the vertical direction is less than 3 degrees.

3. The method according to claim 1, wherein oxidizing the material on the plurality of substrates or depositing the material onto the plurality of substrates comprises heating the vertical oven to a temperature above 80% of a melting point of the substrate of the plurality of substrates.

4. The method according to claim 3, wherein the substrates comprise a material selected from the group consisting of silicon-based semiconductor substrates, silicon carbide-based semiconductor substrates, gallium arsenide-based semiconductor substrates, gallium nitride-based semiconductor substrates, aluminum gallium nitride-based semiconductor substrates and gallium nitride-based semiconductor substrates.

5. The method according to claim 1, wherein depositing the material onto the plurality of substrates comprises depositing the material selected from the group consisting of tetraethyl orthosilicate, polysilicon, doped amorphous silicon, undoped amorphous silicon and silicon nitride.

6. The method according to claim 1, wherein main surfaces of the plurality of substrates carried by the substrate carrier at the predefined positions are substantially parallel to each other.

7. The method according to claim 1, further comprising:
   receiving the substrate carrier into a holding position in a substrate carrier support structure in a direction substantially orthogonal to an insertion direction of the substrate carrier support structure into the vertical oven; and
   inserting the substrate carrier support structure along the insertion direction into the vertical oven.

8. The method according to claim 7, wherein the substrate carrier and the substrate carrier support structure comprise quartz, aluminum oxide, silicon or silicon carbide.

9. The method according to claim 7, further comprising:
   guiding the substrate carrier in a direction substantially orthogonal to the insertion direction towards the holding position by engaging a first lateral guide and a second lateral guide located respectively on a first lateral side and an opposite second lateral side of the substrate carrier with a first lateral guide and a second lateral guide located respectively in a first longitudinal support structure and a second longitudinal support structure of the substrate carrier support structure; and
   receiving the substrate carrier into the holding position by stopping the insertion of the substrate carrier at the holding position by a third longitudinal support structure of the substrate carrier support structure.

10. The method according to claim 7, further comprising preventing a movement of the substrate carrier at the holding position in a direction by fastening a fastening structure located on a third lateral side of the substrate carrier to a third longitudinal support structure.

11. The method according to claim 1, wherein the substrates of the plurality of substrates are substantially equal substrates.

12. The method according to claim 1, wherein the vertical direction is substantially parallel to a vertical axis of the vertical oven or a direction of gravity.

13. A method for forming a material layer on a substrate, the method comprising:
   inserting the substrate into a vertical oven, wherein an angle measured between a main surface of the substrate and a vertical direction is less than 20 degrees; and
   forming the material layer on the substrate.

14. The method according to claim 13, wherein forming the material layer on the substrate comprises oxidizing or depositing material onto the substrate.

15. A method for oxidizing material or depositing material, the method comprising:
   carrying a plurality of substrates by a substrate carrier;
   receiving the substrate carrier into a holding position in a substrate carrier support structure in a direction substantially orthogonal to an insertion direction of the substrate carrier support structure into an vertical oven;
   inserting the substrate carrier support structure along the insertion direction into the vertical oven, wherein the plurality of substrates are held by the substrate carrier in predefined positions, wherein an angle measured between a main surface of a substrate of the plurality of substrates at one of the predefined positions and a vertical direction is less than 20 degrees; and
   oxidizing a material on the plurality of substrates or depositing a material onto the plurality of substrates.

* * * * *